United States Patent
Ukwedeh et al.

(10) Patent No.: US 9,983,255 B2
(45) Date of Patent: May 29, 2018

(54) APPARATUS FOR TESTING DIELECTRIC BREAKDOWN VOLTAGE

(71) Applicant: The Boeing Company, Chicago, IL (US)

(72) Inventors: Victor U. Ukwedeh, North Charleston, SC (US); Zoey M. Henson, New Orleans, LA (US); Dan Maddex, Melbourne, FL (US)

(73) Assignee: The Boeing Company, Chicago, IL (US)

( * ) Notice: Subject to any disclaimer, the term of this patent is extended or adjusted under 35 U.S.C. 154(b) by 32 days.

(21) Appl. No.: 15/236,812

(22) Filed: Aug. 15, 2016

(65) Prior Publication Data

US 2018/0045770 A1    Feb. 15, 2018

(51) Int. Cl.
*H01H 31/12*    (2006.01)
*G01R 31/16*    (2006.01)

(52) U.S. Cl.
CPC .................................... *G01R 31/16* (2013.01)

(58) Field of Classification Search
CPC ........ G01R 21/133; G01R 27/14; G06F 13/20
USPC ............. 324/76.11, 76.61, 76.69, 76.74, 103
See application file for complete search history.

(56) References Cited

U.S. PATENT DOCUMENTS

| | | | |
|---|---|---|---|
| 4,634,963 A | 1/1987 | Lunden | |
| 5,597,762 A * | 1/1997 | Popovici | H01J 9/022 257/E21.05 |
| 6,617,972 B2 * | 9/2003 | Takarada | G08B 21/0484 324/538 |
| 8,574,536 B2 * | 11/2013 | Boudou | C01B 31/065 204/173 |
| 8,779,729 B2 * | 7/2014 | Shiraishi | G01R 31/3606 320/134 |
| 9,194,769 B1 | 11/2015 | Senibi et al. | |
| 2012/0098518 A1 * | 4/2012 | Unagami | G01R 22/066 324/74 |
| 2016/0097702 A1 * | 4/2016 | Zhao | G01N 3/08 73/799 |

OTHER PUBLICATIONS

ASTM Standard D149-09—"Standard Test Method for Dielectric Breakdown Voltage and Dielectric Strength of Solid Electrical Insulating Materials at Commercial Power Frequencies"—2013.

\* cited by examiner

*Primary Examiner* — Giovanni Astacio-Oquendo
(74) *Attorney, Agent, or Firm* — Economou Silfin LLP; John S. Economou

(57) ABSTRACT

A test fixture for testing a material according to a particular test procedure. A metallic base and four non-conductive side panels are affixed along a periphery of the base to form an internal cavity, and a non-conductive top cover is hingedly connected to one side panel. A metallic bottom electrode has an upper surface for holding a test material and a lower portion installed into a first aperture in an upper surface of the base. A metallic top electrode has a lower portion with a lower surface for contacting the test material and an upper portion extending out of a cover aperture in the top cover when the lower surface is in contact with the test material. A voltage source is coupled to perform the testing via a terminal on the base and the upper portion of the top electrode.

20 Claims, 5 Drawing Sheets

APPARATUS FOR TESTING DIELECTRIC BREAKDOWN VOLTAGE

FIELD

This disclosure relates generally to an apparatus for testing dielectric breakdown voltage, and particularly for testing dielectric breakdown voltage of solid insulating materials via liquid immersion.

BACKGROUND

American Society for Testing and Materials (ASTM) Standard D149 provides for the determination of the dielectric strength of solid insulating materials at commercial power frequencies (e.g., 60 Hz) and under specific conditions. This Standard allows the testing to be performed at various temperatures and in an suitable gaseous or liquid surrounding medium. The solid insulating material is placed between two electrodes during the test procedure set forth in this Standard, with the electrodes typically included within an enclosure capable of holding a desired liquid surrounding medium. Conventional test fixtures for performing the testing according to this Standard have a number of drawbacks. One drawback is that the bottom electrode is mounted to the bottom of the enclosure with external wiring connected directly to the bottom electrode and without any ground plane provide in the enclosure. This makes it difficult to remove the bottom electrode from the enclosure (for replacement, cleaning, etc.) and difficult to attach the ground connection to the test voltage source. Another drawback is that a removable top lid is provided that sits over the top of the enclosure, with the top electrode fixedly mounted in an aperture in the lid. This configuration makes it difficult to properly position the lid so that the top electrode is positioned properly over the test sample on the upper surface of the bottom electrode.

Accordingly, there is a need for an apparatus for testing dielectric breakdown voltage which overcomes the problems recited above.

SUMMARY

In a first aspect, a test fixture for testing a material includes a base, four side panels and a top cover. The base is formed from metal and has a predetermined length, width and thickness. A first aperture is included in a central portion of an upper surface of the base. The four side panels are formed from a non-conductive material and are affixed along an upper periphery of the upper surface of the base to form an internal cavity. A metallic bottom electrode has an upper portion with an upper surface for holding a material to be tested, a central portion, and a lower portion inserted into the first aperture in the central portion of the upper surface of the base. The top cover is formed from a non-conductive material and is hingedly connected to one of the four side panels. The top cover has a cover aperture therein positioned directly over the first aperture in the base when the top cover is positioned over the four side panels. A metallic top electrode has a lower portion with a lower surface for contacting the material to be tested, a central portion, and an upper portion extending out of the cover aperture in the top cover when the lower surface is in contact with the material to be tested.

In a further embodiment, the lower portion of the bottom electrode may have external threads that mate with internal threads in the first aperture in the base to secure the bottom electrode to the base. Alternatively, the lower portion of the bottom electrode may be press fit into the first aperture in the base to secure the bottom electrode to the base. A ground terminal may be installed into a second aperture in the base, the second aperture outside the cavity formed by the four side panels. The ground terminal may include an internal portion and an external portion, and the internal portion of the ground terminal may have external threads that mate with internal threads in the second aperture in the base to secure the ground terminal to the base. Alternatively, the ground terminal may include an internal portion and an external portion, and the internal portion of the ground terminal may be press fit into the second aperture in the base to secure the ground terminal to the base. A drain valve may be mounted in a panel aperture in a lower portion of one of the side panels. The upper portion of the bottom electrode may have a cylindrical shape having a first diameter, the central portion of the bottom electrode may have a cylindrical shape having a second diameter, with the first diameter preferably greater than the second diameter. The lower portion of the top electrode may have a cylindrical shape having a first diameter, the central portion of the top electrode may have a cylindrical shape having a second diameter, and the upper portion of the top electrode may have a cylindrical shape having a third diameter, with the first diameter preferably greater than the second diameter and the third diameter. The bottom and top electrodes may be formed from brass, which may be brass alloy 360. The upper portion of the top electrode may have an upper surface with a threaded aperture therein, and a terminal may be installed in the threaded aperture in the upper surface of the upper portion of the top electrode. The base may be formed from aluminum. The side panels may be formed from acrylic glass or polycarbonate. The side panels may be affixed to the base using a polycarbonate adhesive. The side panels may be affixed to each other to form the internal cavity using a polycarbonate adhesive.

In a second embodiment, a test fixture for testing a material includes a hollow enclosure formed from a base, four side panels, and a top cover. The base is formed from metal and has a predetermined length, width and thickness. The base has a first aperture included in a central portion of an upper surface thereof. The four side panels are formed from a non-conductive material. The four side panels are affixed along an upper periphery of the upper surface of the base to form the hollow enclosure. A metallic bottom electrode has an upper portion with an upper surface for holding a material to be tested, a central portion, and a lower portion inserted into the first aperture in the central portion of the upper surface of the base. The top cover is formed from a non-conductive material and is hingedly connected to one of the four side panels. The top cover has a cover aperture therein positioned directly over the first aperture in the base when the top cover is positioned over the four side panels. A metallic top electrode has a lower portion with a lower surface for contacting the material to be tested, a central portion, and an upper portion extending out of the cover aperture in the top cover when the lower surface is in contact with the material to be tested.

In a third aspect, a method of using a test fixture for testing a material. The test fixture has a metallic base, four non-conductive side panels affixed along an upper periphery of an upper surface of the base to form an internal cavity, and a non-conductive cover hingedly attached to one of the four non-conductive side panels. A metallic bottom electrode is installed into a first aperture included in a central portion of an upper surface of the base with the non-conductive cover in an open position allowing access to the internal cavity. A material to be tested is inserted onto an upper surface of the metallic bottom electrode with the non-conductive top cover in an open position allowing access to the internal cavity, a lower surface of the material to be tested in contact with the upper surface of the metallic bottom electrode. A metallic top electrode is installed over the material to be tested such that a lower surface of the metallic top electrode is in contact with an upper surface of the material to be tested. The non-conductive top cover is closed to preclude access to the internal cavity. The non-conductive top cover has a cover aperture positioned directly over the first aperture in the base when the cover is closed. An upper portion of the metallic top electrode protrudes through and extending out of the cover aperture in the top cover. A first cable is coupled between a positive terminal of a test voltage source and the upper portion of the metallic top electrode extending out of the cover aperture in the non-conductive top cover when the lower surface of the metallic top electrode is in contact with the upper surface of the material to be tested. A second cable is coupled between a negative terminal of a test voltage source and the base. Finally, a test procedure is conducted.

The features, functions, and advantages that have been discussed can be achieved independently in various embodiments or may be combined in yet other embodiments, further details of which can be seen with reference to the following description and drawings.

BRIEF DESCRIPTION OF THE DRAWINGS

The following detailed description, given by way of example and not intended to limit the present disclosure solely thereto, will best be understood in conjunction with the accompanying drawings in which.

DETAILED DESCRIPTION

In the present disclosure, like reference numbers refer to like elements throughout the drawings, which illustrate various exemplary embodiments of the present disclosure.

Figure 1:
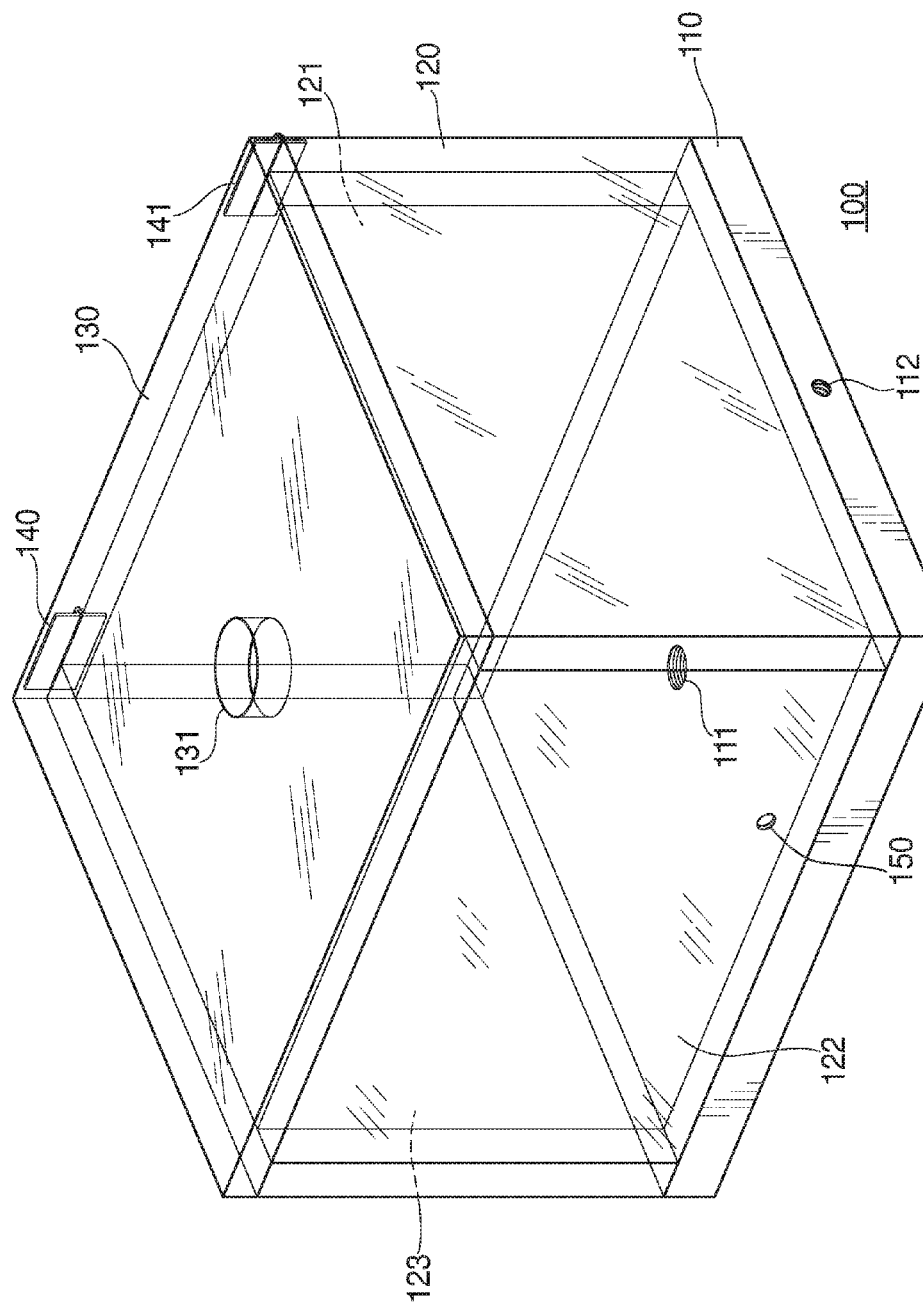
FIG. 1 is a perspective view of a test fixture of the present disclosure without the top and bottom electrodes and ground terminal installed.

Referring now to FIG. 1, a test fixture 100 is shown which includes a base 110 formed from a metallic (preferably aluminum) panel (plate) preferably having a thickness of three-quarter inch. Test fixture 100 also includes side panels 120, 121, 122, 123 and a top cover 130. Side panels 120, 121, 122, 123 and top cover 130 are preferably formed from a transparent non-conductive material such as an acrylic glass (polymethyl methacrylate) having a thickness of one-half inch, although other types of transparent non-conductive materials may be used (e.g., clear polycarbonate). In some cases it may be possible to use non-transparent non-conductive materials (e.g., panels formed from a non-transparent polycarbonate). Top cover 130 is attached to one side panel 121 via hinges 140, 141. When top cover 130 is in an open position, top cover 130 allows access to the internal cavity formed by base 110 and side panels 120, 121, 122, 123. When top cover 130 is in a closed position (as shown in FIG. 1), no access is available to that internal cavity (except through cover aperture 131 discussed below). The side panels 120, 121, 122, 123 are joined together and to base 110 via an appropriate adhesive (e.g., a polycarbonate adhesive) to form a leak-proof seal. In some cases additional sealant may be used along each joint to ensure that the interior cavity is leak-proof when filled with a liquid. Hinges 140, 141 may be attached to side panel 121 and to top cover 130 using an adhesive or using fasteners (e.g., screws). A first threaded aperture 111 is provided in the center of the upper portion of base 110, and a second threaded aperture 112 is provided in a side portion of base 110. The first threaded aperture 111 preferably has a diameter of one-half inch and a depth of one-half inch. The second threaded aperture 112 preferably has a diameter of one-quarter inch. In some cases, the threads may be omitted in apertures 111 and 112 (e.g., when press fit parts are installed therein). Top cover 130 includes a cover aperture 131 in a central portion thereof that is positioned directly over first threaded aperture 111. Cover aperture 131 preferably has a diameter of 1⅛ inch. In a preferred embodiment, base 110 has a size of 8"×9"×¾" with the side panels 120, 121, 122, 123 having a size of 8"×6"×½" and the cover having a size of 9"×8"×½". An arbitrary one of the four side panels (shown as side panel 122 in FIG. 1) preferably includes a panel aperture 150 in a lower portion thereof for accepting a drain valve 410 (shown and discussed with respect to FIG. 4), although in some circumstances drain valve 410 and panel aperture 150 may be omitted.

Figure 2:
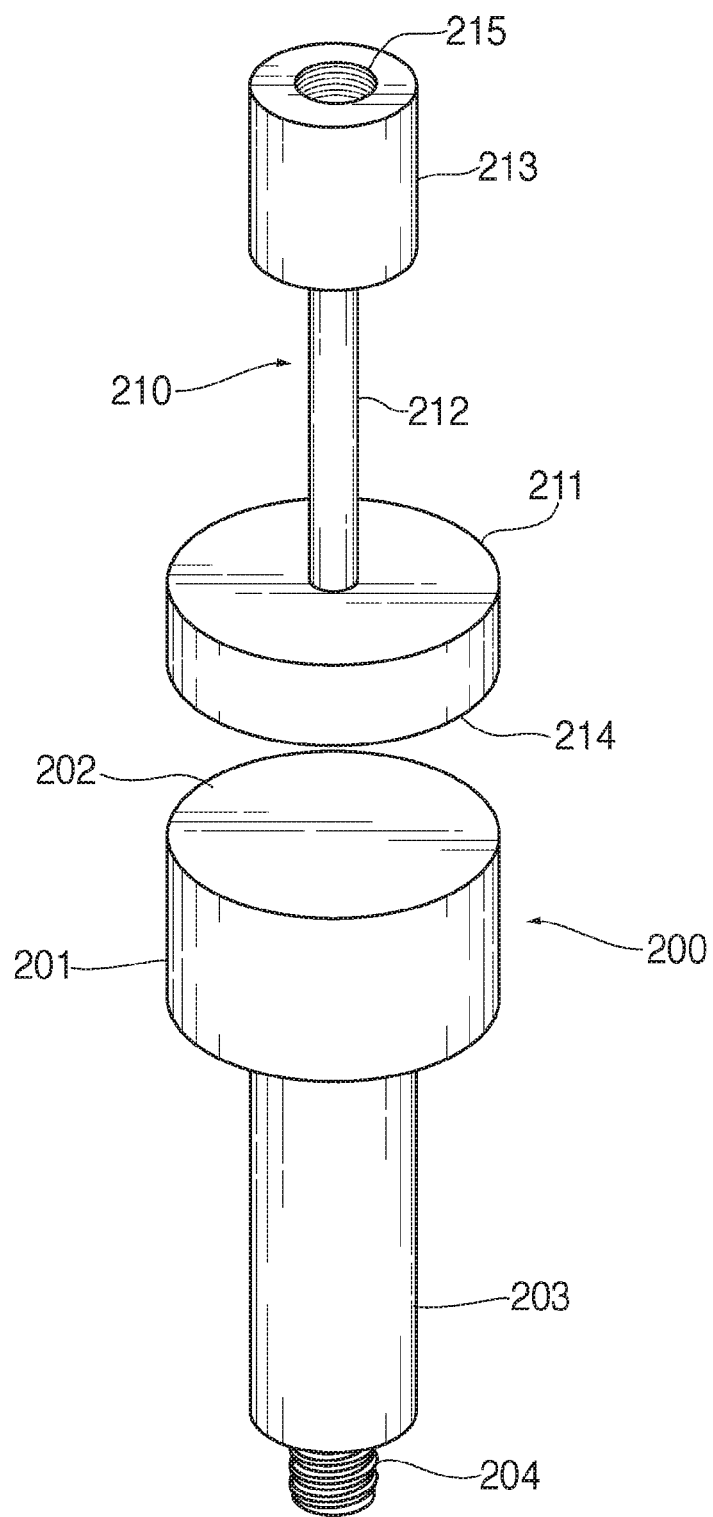
FIG. 2 is a perspective view of the top and bottom electrodes for use in the test fixture of the present disclosure.

Referring now to FIG. 2, a bottom electrode 200 preferably includes an upper cylindrical portion 201, a lower cylindrical portion 203, and a lower threaded portion 204. The upper cylindrical portion 201 preferably has a larger diameter than the diameter of the lower cylindrical portion. The upper surface 202 of bottom electrode 200 serves as the lower contact for a material to be tested. The lower threaded portion 204 is sized to fit into first threaded aperture 111 in base 110. In a preferred embodiment, the diameter of upper cylindrical portion 201 is two inches, the diameter of lower cylindrical portion 203 is one inch, and the threaded portion has a diameter of one-half inch. Bottom electrode 200 is formed from a metal, preferably an ultra-machinable brass such as brass alloy 360. Although the bottom electrode 200 is shown having a cylindrical form in FIG. 2, the actual form may be changed according to the requirements of the particular test to be employed (e.g., an electrode with a square or rectangular cross-section could be used instead).

Top electrode 210 includes an upper cylindrical portion 213, a central cylindrical portion 212 and a lower cylindrical portion 211. The lower cylindrical portion 211 of top electrode 210 has a same diameter as the diameter of the upper cylindrical portion 201 of bottom electrode 200. The diameter of lower cylindrical portion 211 is preferably greater than the diameter of central cylindrical portion 212 and upper cylindrical portion 213. The diameter of upper cylindrical portion 213 is preferably greater than the diameter of central cylindrical portion 212. The lower surface 214 of top electrode 210 serves as the upper contact for the material to be tested. Upper cylindrical portion 213 preferably includes a threaded aperture 215 for receiving a mounting terminal which, preferably, has a diameter of one-quarter inch. In a preferred embodiment, the diameter of upper cylindrical portion 213 is one inch, the diameter of central cylindrical portion 212 is one-half inch, and the diameter of lower cylindrical portion 211 is two inches. Top electrode 210 is formed from a metal, preferably an ultra-machinable brass such as brass alloy 360. Although the top electrode 210 is shown having a cylindrical form in FIG. 2, the actual form may be changed according to the requirements of the particular test to be employed (e.g., an electrode with a square or rectangular cross-section could be used instead).

Figure 3:
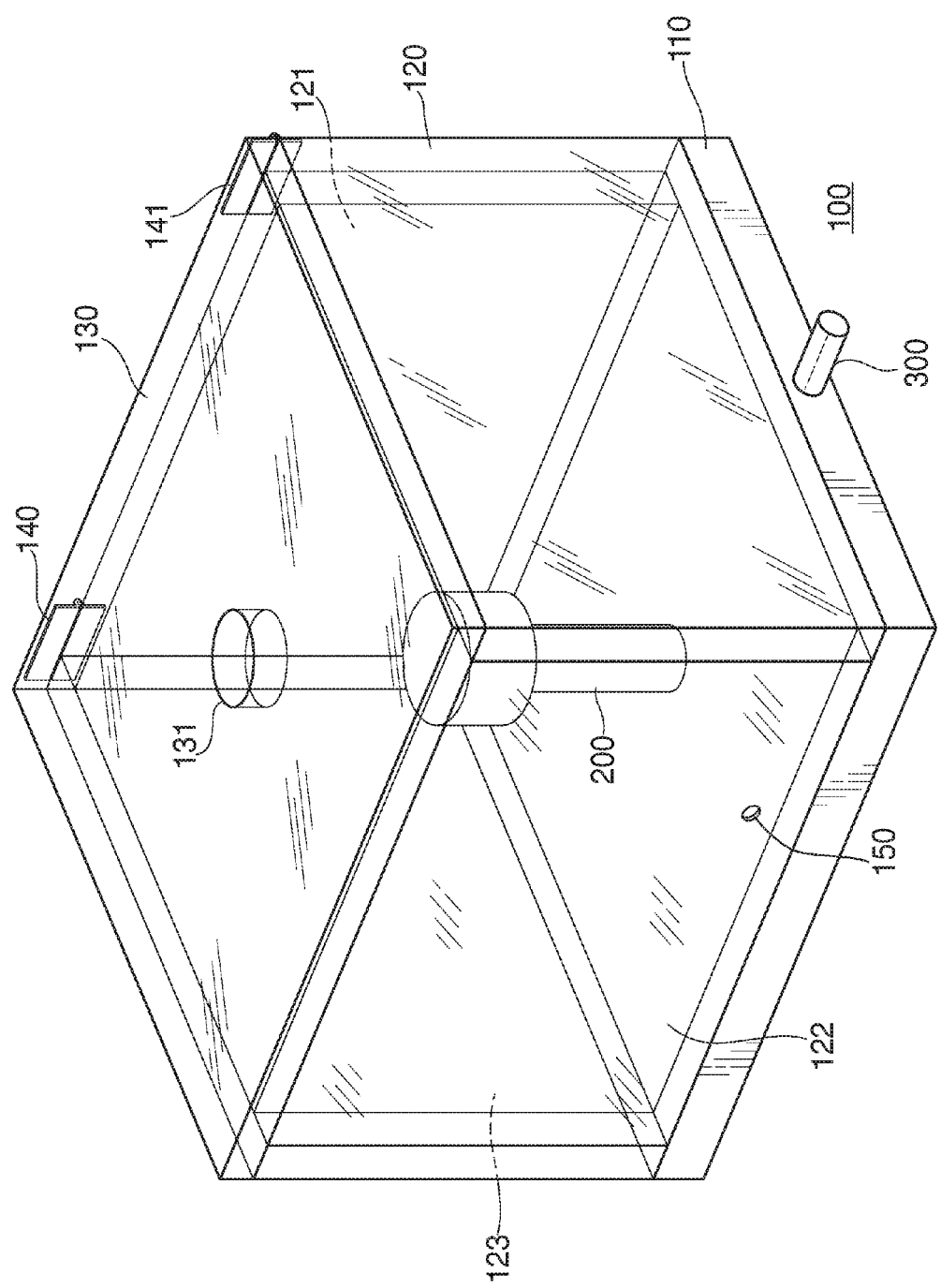
FIG. 3 is a perspective view of the test fixture shown in FIG. 1 with the bottom electrode and ground terminal installed.

Referring now to FIG. 3, test fixture 100 is shown with bottom electrode 200 installed in first threaded aperture 111 via lower threaded portion 204 (not shown in FIG. 3) and with a ground terminal 300 installed in second threaded aperture 112 via threads not shown. In some situations, the lower threaded portion 204 and the threads on ground terminal 300 may be replaced with an alternative configuration (e.g., a press-fit connection).

Figure 4:
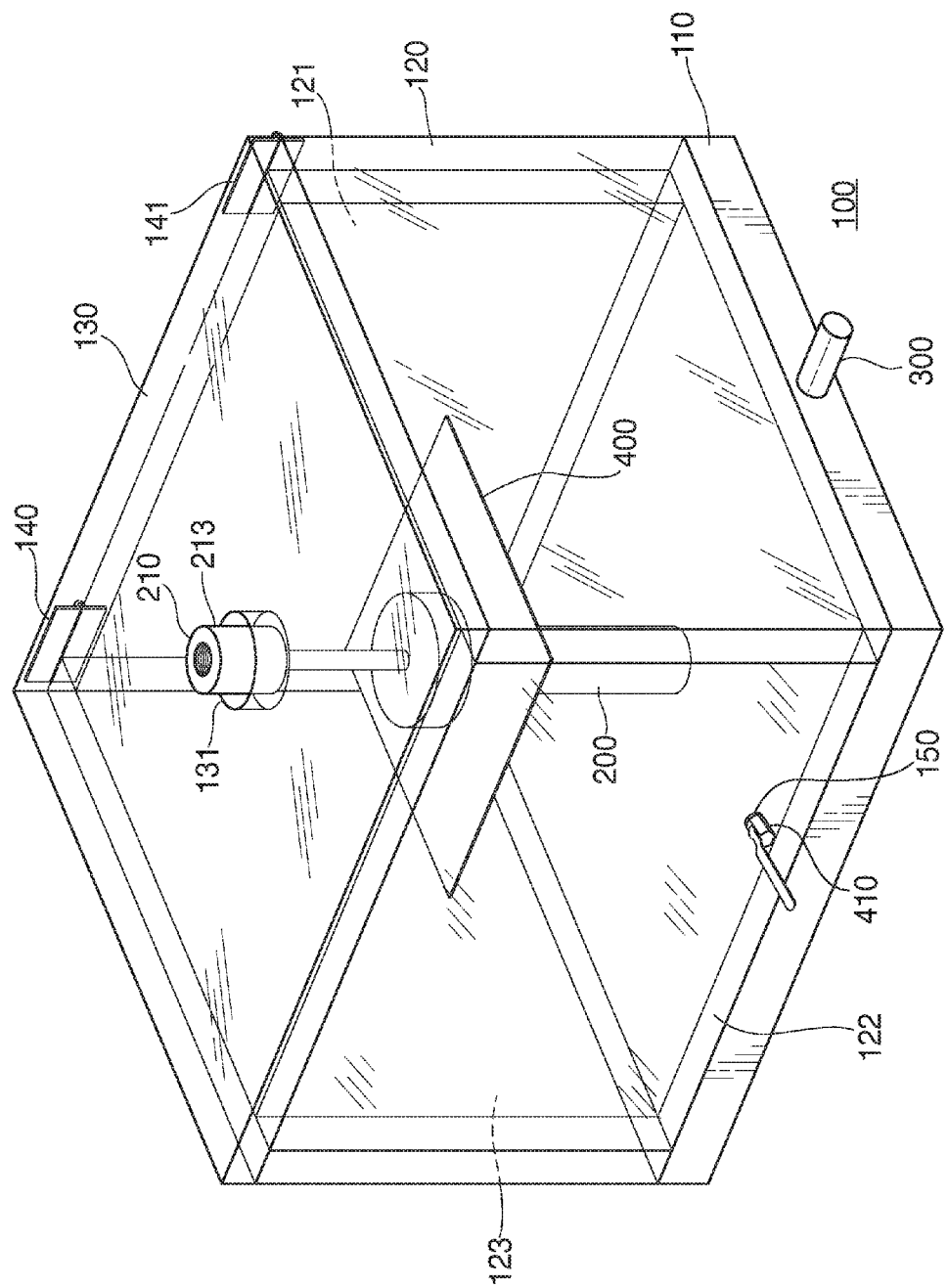
FIG. 4 is a perspective view of the test fixture shown in FIG. 3 with the top electrode installed.

Referring now to FIG. 4, test fixture 100 is shown with a test material 400 inserted over the upper surface 202 (not shown in FIG. 4) of bottom electrode 200, and with top electrode 210 inserted over the upper surface of test material 400 and with the upper cylindrical portion 213 of top electrode 210 positioned within cover aperture 131 of the hinged top cover 130. To prepare for the test procedure to be conducted, the test material 400 is first placed on the upper surface 202 of bottom electrode 200, the top electrode 210 is placed over the test material 400, and then the top cover 130 is closed. A lower surface of test material 400 is in contact with the upper surface 202 (FIG. 2) of bottom electrode 200. An upper surface of test material 400 is in contact with the lower surface 214 (FIG. 2) of top electrode 210. Top electrode 210 is self-weighting and, once in position, holds test material 400 securely in place for testing. Furthermore, a drain valve 410 is shown installed in panel aperture 150 for use in more quickly draining any liquid medium contained within the interior cavity of test fixture 100.

Figure 5:
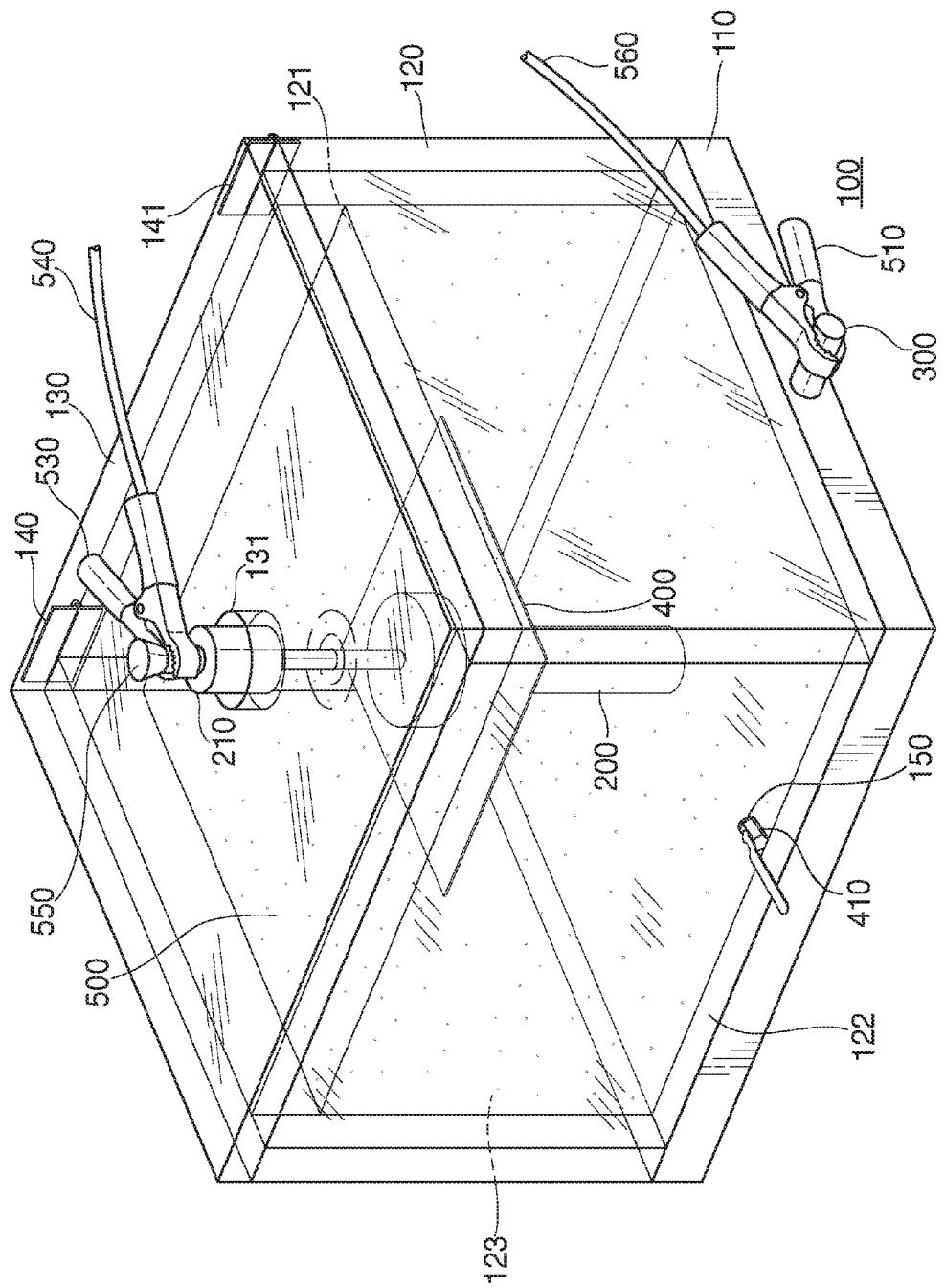
FIG. 5 is a perspective view of the test fixture shown in FIG. 2 after the enclosure is filled with a liquid medium and with cable clips attached to the ground terminal and a mounting terminal installed in the top electrode.

Finally, referring now to FIG. 5, test fixture 100 is shown with a terminal 550 installed in aperture 215 of top electrode and a first cable clamp 530 attached to terminal 550. First cable clamp 530 is attached to a first cable 540 that is coupled to a positive terminal of a voltage source (not shown) appropriate for the type of testing being conducted (i.e., according to a predetermined test procedure). A second cable clamp 510 is attached to ground terminal 300. Second cable clamp 510 is attached to a second cable 560 that is coupled to a negative terminal of the voltage source. Test fixture 100 is shown filled with a liquid medium 500. The type of liquid medium 500 used depends on the type of testing being conducted, and in some cases liquid medium 500 may be omitted and testing can be conducted in air instead of liquid. Once the first and second cable clamps 530, 510 are coupled as shown in FIG. 5, the voltage source may be operated as appropriate for the type of testing being conducted (e.g., as set forth in ASTM D 149).

Test fixture 100 provides advantages over previous solutions. First, base 110 acts as a ground plane and allows easier connection to the ground connection of the test voltage source via ground terminal 300. In addition, the ability to easily install and remove bottom electrode 200 makes cleanup much easier after a testing session than with test fixtures in which a bottom electrode is permanently installed. Furthermore, the addition of drain valve 410 also allows quicker and easier way to change the liquid medium used for testing.

Although the present disclosure has been particularly shown and described with reference to the preferred embodiments and various aspects thereof, it will be appreciated by those of ordinary skill in the art that various changes and modifications may be made without departing from the spirit and scope of the disclosure. It is intended that the appended claims be interpreted as including the embodiments described herein, the alternatives mentioned above, and all equivalents thereto.

What is claimed is:

1. A test fixture for testing a material, comprising:
 a base formed from metal and having a predetermined length, width and thickness, a first aperture included in a central portion of an upper surface thereof;
 four side panels formed from a non-conductive material, the four side panels affixed along an upper periphery of the upper surface of the base to form an internal cavity;
 a metallic bottom electrode having an upper portion with an upper surface for holding a material to be tested, a central portion, and a lower portion inserted into the first aperture in the central portion of the upper surface of the base;
 a top cover formed from a non-conductive material, the top cover hingedly connected to one of the four side panels, the top cover having a cover aperture therein positioned directly over the first aperture in the base when the top cover is positioned over the four side panels; and
 a metallic top electrode having a lower portion with a lower surface for contacting the material to be tested, a central portion, and an upper portion extending out of the cover aperture in the top cover when the lower surface is in contact with the material to be tested.

2. The test fixture of claim 1, wherein the lower portion of the bottom electrode has external threads that mate with internal threads in the first aperture in the base to secure the bottom electrode to the base.

3. The test fixture of claim 1, wherein the lower portion of the bottom electrode is press fit into the first aperture in the base to secure the bottom electrode to the base.

4. The test fixture of claim 1, further comprising a ground terminal installed into a second aperture in the base, the second aperture outside the cavity formed by the four side panels.

5. The test fixture of claim 4, wherein the ground terminal includes an internal portion and an external portion, and wherein the internal portion of the ground terminal has external threads that mate with internal threads in the second aperture in the base to secure the ground terminal to the base.

6. The test fixture of claim 4, wherein the ground terminal includes an internal portion and an external portion, and wherein the internal portion of the ground terminal is press fit into the second aperture in the base to secure the ground terminal to the base.

7. The test fixture of claim 1, further comprising a drain valve mounted in a panel aperture in a lower portion of one of the side panels.

8. The test fixture of claim 1, wherein the upper portion of the bottom electrode has a cylindrical shape having a first diameter, the central portion of the bottom electrode has a cylindrical shape having a second diameter, and wherein the first diameter is greater than the second diameter.

9. The test fixture of claim 1, wherein the lower portion of the top electrode has a cylindrical shape having a first diameter, the central portion of the top electrode has a cylindrical shape having a second diameter, and the upper portion of the top electrode has a cylindrical shape having a third diameter, wherein the first diameter is greater than the second diameter and the third diameter.

10. The test fixture of claim 9, wherein the upper portion of the top electrode has an upper surface with a threaded aperture therein, and wherein a terminal is installed in the threaded aperture in the upper surface of the upper portion of the top electrode.

11. The test fixture of claim 1, wherein the bottom electrode is formed from brass.

12. The test fixture of claim 1, wherein the top electrode is formed from brass.

13. The test fixture of claim 1, wherein the top electrode and the bottom electrode are each formed from brass alloy 360.

14. The test fixture of claim 1, wherein the base is formed from aluminum.

15. The test fixture of claim 1, wherein the side panels are formed from acrylic glass.

16. The test fixture of claim 15, wherein the side panels are affixed to the base using a polycarbonate adhesive.

17. The test fixture of claim 15, wherein the side panels are affixed to each other to form the internal cavity using a polycarbonate adhesive.

18. The test fixture of claim 1, wherein the side panels are formed from polycarbonate.

19. A test fixture for testing a material, comprising:
    a hollow enclosure formed from a base, four side panels, and a top cover, wherein:
    the base is formed from metal and has a predetermined length, width and thickness, the base having a first aperture included in a central portion of an upper surface thereof; and
    the four side panels are formed from a non-conductive material, the four side panels affixed along an upper periphery of the upper surface of the base to form the hollow enclosure;
    a metallic bottom electrode having an upper portion with an upper surface for holding a material to be tested, a central portion, and a lower portion inserted into the first aperture in the central portion of the upper surface of the base;
    a top cover formed from a non-conductive material, the top cover hingedly connected to one of the four side panels, the top cover having a cover aperture therein positioned directly over the first aperture in the base when the cover is positioned over the four side panels; and
    a metallic top electrode having a lower portion with a lower surface for contacting the material to be tested, a central portion, and an upper portion extending out of the cover aperture in the top cover when the lower surface is in contact with the material to be tested.

20. A method of using a test fixture for testing a material, the test fixture having a metallic base, four non-conductive side panels affixed along an upper periphery of an upper surface of the base to form an internal cavity, and a non-conductive top cover hingedly attached to one of the four non-conductive side panels, comprising the steps of:
    installing a metallic bottom electrode into a first aperture included in a central portion of an upper surface of the base with the non-conductive top cover in an open position allowing access to the internal cavity;
    inserting a material to be tested onto an upper surface of the metallic bottom electrode with the non-conductive top cover in an open position allowing access to the internal cavity, a lower surface of the material to be tested in contact with the upper surface of the metallic bottom electrode;
    installing a metallic top electrode over the material to be tested such that a lower surface of the metallic top electrode is in contact with an upper surface of the material to be tested;
    closing the non-conductive top cover to preclude access to the internal cavity, the non-conductive top cover having a cover aperture positioned directly over the first aperture in the base when the top cover is closed, an upper portion of the metallic top electrode protruding through and extending out of the cover aperture in the top cover;
    coupling a first cable between a positive terminal of a test voltage source and the upper portion of the metallic top electrode extending out of the cover aperture in the non-conductive top cover when the lower surface of the metallic top electrode is in contact with the upper surface of the material to be tested;
    coupling a second cable between a negative terminal of the test voltage source and the base; and
    conducting a test procedure by operating the test voltage source according to a predetermined test standard.

* * * * *